(12) United States Patent
Love

(10) Patent No.: US 7,030,624 B1
(45) Date of Patent: Apr. 18, 2006

(54) ELECTRICAL CIRCUIT TESTER

(75) Inventor: Frank Love, Amarillo, TX (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 11/059,861

(22) Filed: Feb. 17, 2005

(51) Int. Cl.
*G01R 31/02* (2006.01)

(52) U.S. Cl. .................. 324/555; 324/556; 324/508

(58) Field of Classification Search ............ 324/158.1, 324/765, 754, 72.5
See application file for complete search history.

(56) References Cited

U.S. PATENT DOCUMENTS

| | | | |
|---|---|---|---|
| 1,948,729 A * | 2/1934 | Miller | 455/226.4 |
| 2,014,379 A * | 9/1935 | Hockner | 324/407 |
| 3,898,557 A * | 8/1975 | Strock | 324/508 |
| 4,002,861 A * | 1/1977 | Putt | 379/21 |
| 4,015,201 A | 3/1977 | Chaffee | |
| 4,825,150 A | 4/1989 | Sirasud | |
| 4,929,887 A | 5/1990 | Robitaille et al. | |
| 5,543,707 A | 8/1996 | Yoneyama et al. | |
| 6,137,285 A | 10/2000 | Walsten et al. | |

* cited by examiner

*Primary Examiner*—Jermele Hollington
*Assistant Examiner*—Jimmy Nguyen
(74) *Attorney, Agent, or Firm*—Elmer A. Klavetter

(57) ABSTRACT

An electrical circuit testing device is provided, comprising a case, a digital voltage level testing circuit with a display means, a switch to initiate measurement using the device, a non-shorting switching means for selecting pre-determined electrical wiring configurations to be tested in an outlet, a terminal block, a five-pole electrical plug mounted on the case surface and a set of adapters that can be used for various multiple-pronged electrical outlet configurations for voltages from 100–600 VAC from 50–100 Hz.

11 Claims, 4 Drawing Sheets a) a two-pronged connector b) a three-pronged connector c) a four-pronged connector d) a five-pronged connector

ELECTRICAL CIRCUIT TESTER

This invention was made with Government support under Contract No. DE-AC04-94AL85000 awarded by the Department of Energy. The Government has certain rights in the invention.

BACKGROUND OF THE INVENTION

The invention describes an electrical circuit tester and, more particularly, to a device that can test voltages and wiring in electrical outlets with expected voltages in the range of 100V to 600V alternating current.

When electrical outlets are installed in a residential or business facility, it is necessary that the outlets are properly wired and that the proper voltage output is known. When an electrical outlet is mis-wired, they can not function or even become a safety hazard, resulting in personal injury or property damage. It is therefore necessary to check each and every electrical outlet when installed. It is also necessary to check the voltage of an already-installed outlet when the user is uncertain of the electrical output characteristics of the outlet.

In the United States, electrical systems are employed using voltages ranging from 110V–600V ac (alternating current) using 2, 3, 4, or 5-pronged outlets at a frequency of 60 Hz. The international community generally uses an electrical system with voltages from 100V∝380V ac using multiple-pronged outlets at 50 Hz and 60 Hz. All electrical systems work with similar characteristics whether in the United States or elsewhere. There is a hot or voltage-carrying conductor (or conductors), a neutral conductor and a ground conductor.

Several devices can be used to check for proper voltage characteristics in an electrical outlet. The most common of these is a volt-ohmmeter. This apparatus typically has a dial for selecting the current, voltage or resistance to be measured, the magnitude range of the electrical signal to be tested and the kind of voltage to be tested, either direct or alternating current. Alternating current voltage can be checked by inserting two probes into the parallel ports; however, a reading of the expected voltage does not necessarily imply that the outlet is wired properly. For example, the polarity can be incorrect. For multiple-pronged outlets, a user may also be unsure of the proper locations in which to insert the two prongs. This can lead to time-consuming or even improper testing of the outlet.

Other available testing devices have similar or alternate deficiencies. Some can only test a limited range of voltages. Others can only test limited outlet configurations, such as a two or three-pronged outlet. Such limitations and others can be overcome by a device that can be used to monitor voltages ranging from 100V–600V ac at 50 Hz or 60 Hz in 2, 3, 4, or 5 pronged electrical outlets.

BRIEF DESCRIPTIONS OF THE DRAWINGS

DESCRIPTION OF SPECIFIC EMBODIMENTS

In the method of the present invention, an electrical circuit testing device is provided, comprising a case, a digital voltage level testing circuit with a display means, a switch to initiate measurement using the device, a non-shorting switching means for selecting pre-determined electrical wiring configurations to be tested in an outlet, a terminal block, a five-pole electrical plug mounted on the case surface and a set of adapters that can be used for various multiple-pronged electrical outlet configurations.

Figure 1:
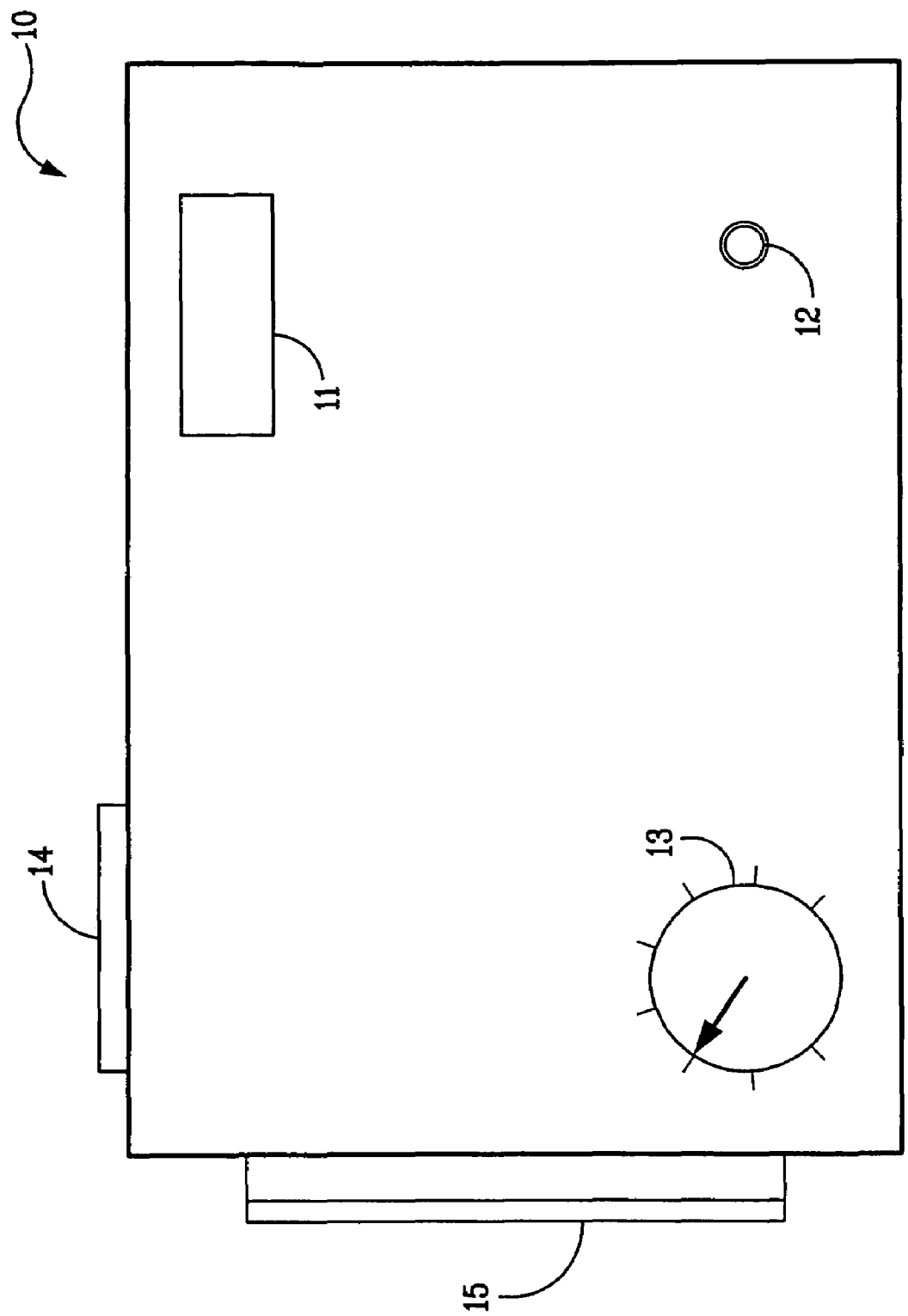
FIG. 1 shows a depiction of the electrical circuit tester case.

Referring to FIG. 1, a case 10 is shown that is the housing incorporating the circuitry used for testing as well as the switches, displays and connections for the device. In one embodiment, a digital display 11 is situated on the top of the case 10. An analog display can be used but a digital display can provide more visual accuracy. Also on the case is an initiator switch 12 to initiate the measurement. This switch can be a switch to turn on and off the device and be depressable or turnable. For example, the switch can be a push switch that only turns on the device measurement when the switch is being pushed. Alternatively, it can be a switch that once pushed, turns the device on until the switch is pushed again to turn the device off. Also shown in FIG. 1 is a rotary switch 13 that can be rotated to different positions to test pre-set wiring configurations. Other switch configurations can be used but a rotary switch offers simplicity from both use and visual recognition considerations. In this embodiment, the switch has eight pre-set wiring configurations, as discussed subsequently. Also shown in FIG. 1, is the adaptor connector 14 that is a 5-prong connector, allowing the flexibility of using a universal adaptor end for the device as all three-phase electrical systems in the United States use 5 wires. FIG. 1 shows a side-view of the physical representation of the adaptor connector 14. The connector, as with all of the other described switches, displays or connectors, can be situated anywhere convenient on the case. Also shown is an optional handle 15 for transporting and holding the device.

Figure 2:
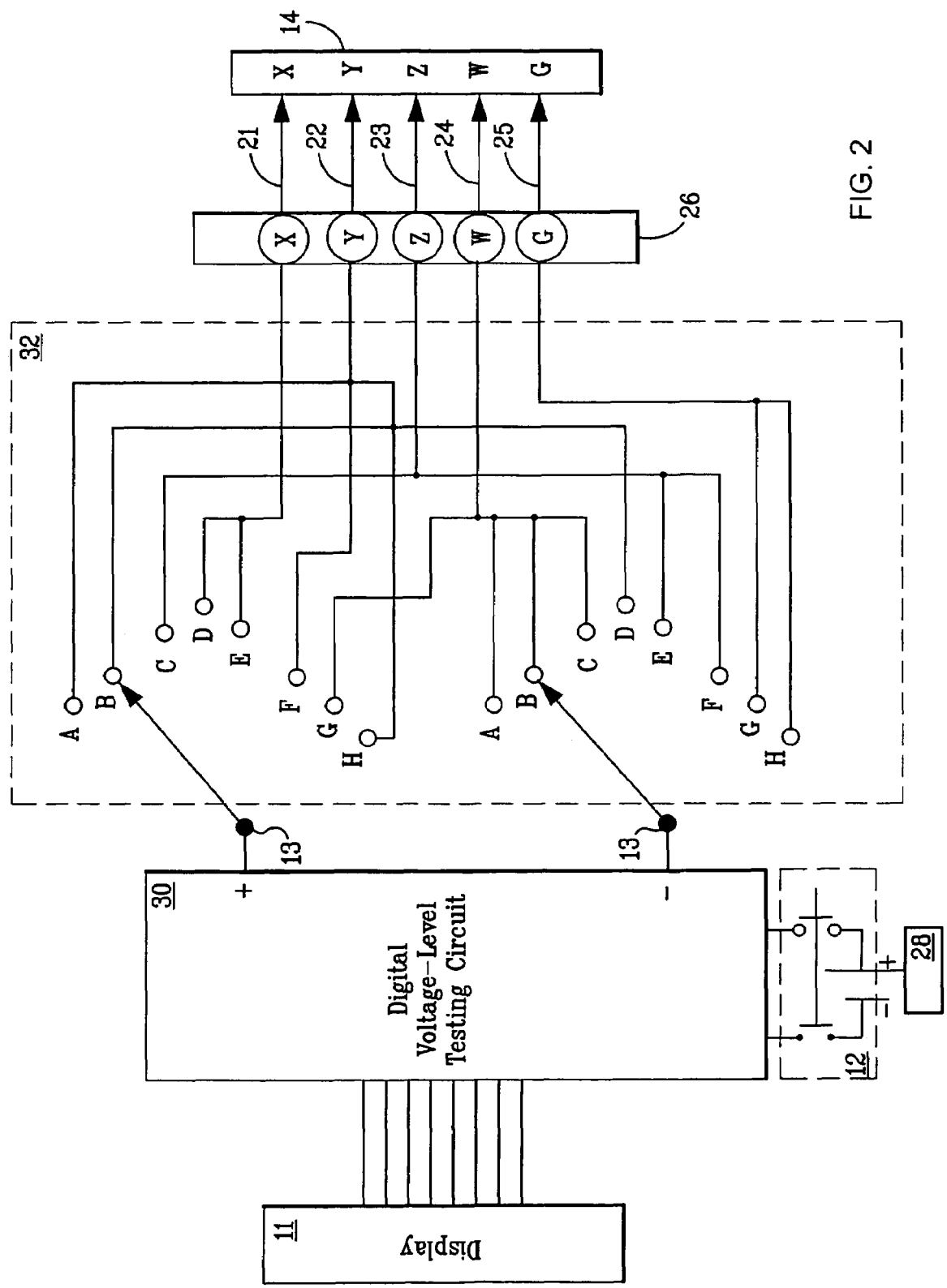
FIG. 2 illustrates the electrical circuitry of the present invention.

FIG. 2 shows the general circuit diagram from the adaptor connector 14 to the digital display 11. There are 5 wires in the general 3-phase electrical system. These wires are designated as 21, 22, and 23 for the wires that are voltage-carrying conductors (these are commonly referred to in standard electrical terminology as the X, Y, and Z wires); wire 24 represents the neutral wire (commonly referred to as the W wire) and wire 25 represents the ground (commonly referred to as the G wire). Terminal 26 is a terminal block used so that multiple connections can be routed from it. There is a digital voltage level testing circuit 30, in one embodiment a digital voltmeter, capable of measuring ac voltages of less than 100V to greater than 600V ac at 50 Hz–100 Hz. A two-pole eight position, non-shorting switch 13 is electrically represented in FIG. 2 and is connected to the digital voltage level testing circuit 30, such as a digital voltmeter (DVM). This digital voltage level testing circuit 30 can be a commercially-available DVM or equivalent circuitry that can test voltage levels from 100V–600V ac. The switch 13 is also electrically connected to the terminal through a switching wiring circuit 32 using standard electrical wiring circuitry such that the following eight wiring connections can be tested: wire 21-wire 24 (X-W); wire 21-wire 22 (X-Y); wire 21-wire 23 (X-Z); wire 21-wire 25 (X-G); wire 22-wire 24 (Y-W); wire 22-wire 23 (Y-Z); wire 23-wire 24 (Z-W), and wire 24-wire 25 (W-G). Also electrically connected to the digital voltage level testing circuit 30 is the electrically-represented initiator switch 12 which is electrically connected to a power source 28, which is generally a battery, such as a 9-volt direct current battery.

Figure 3:
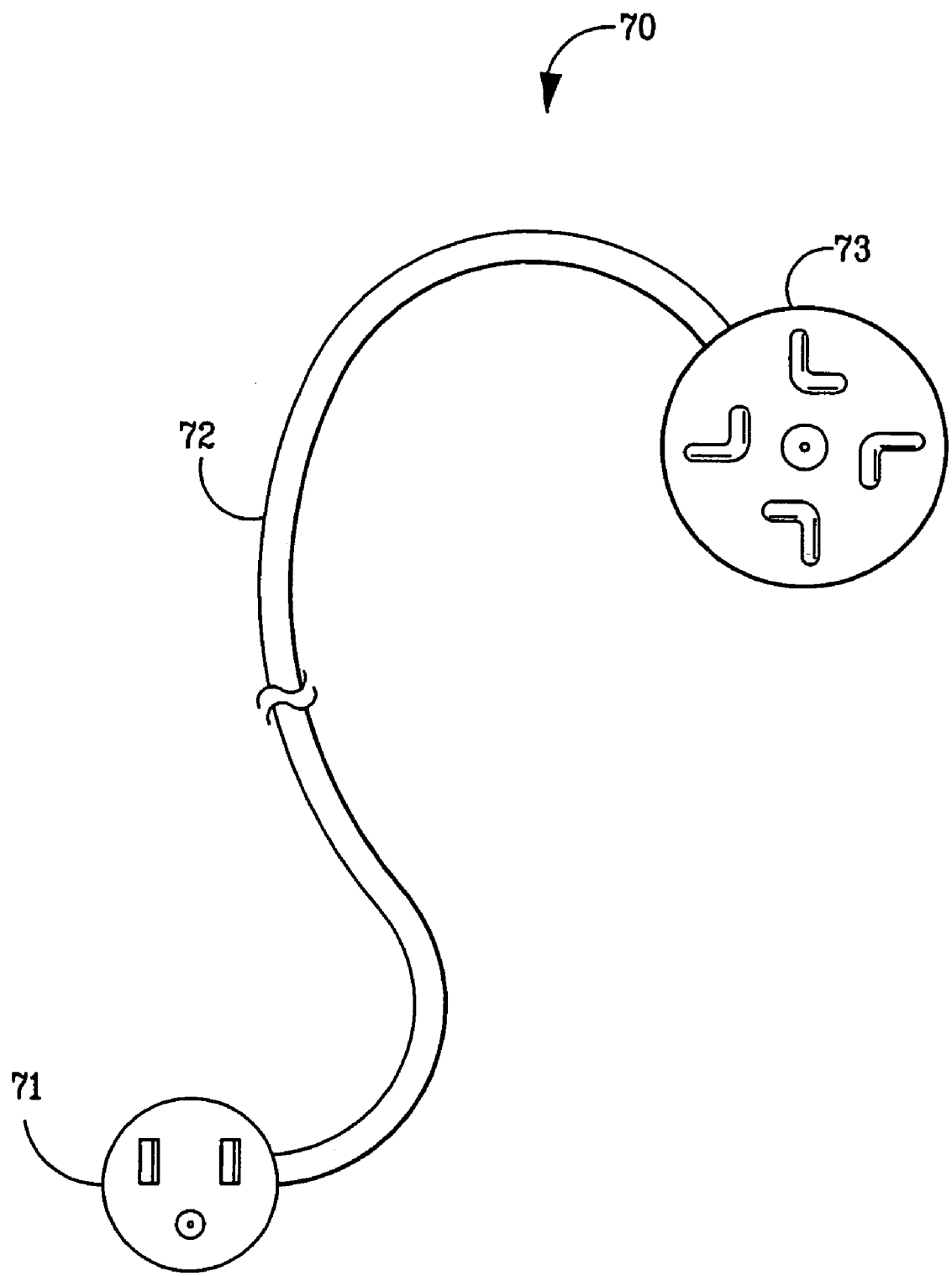
FIG. 3 illustrates one configuration of an adaptor.
Figure 4:
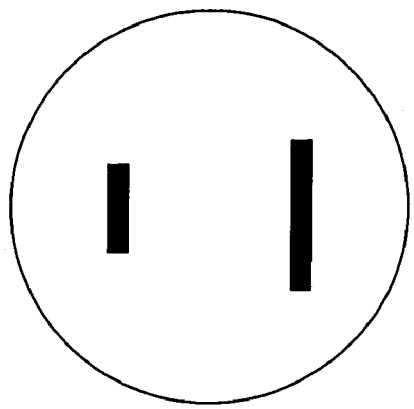
FIG. 4 illustrates various prong configurations of the adaptor of the present invention.
Figure 4:
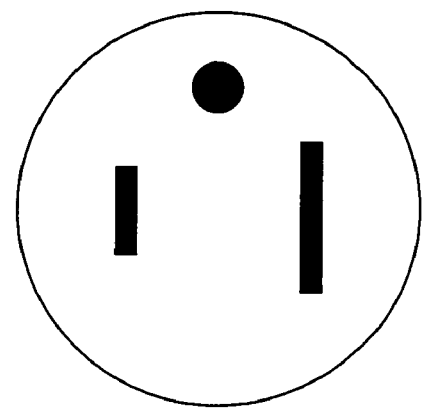
Figure 4:
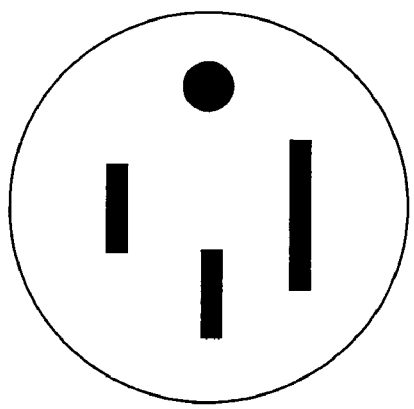
Figure 4:
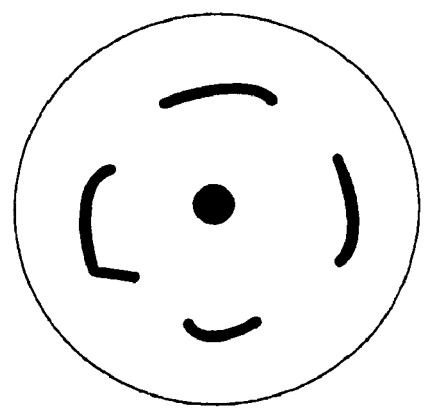

In the device of the present invention, a detachable adaptor is used with one end of the adaptor having an electrical connector that can suitably connect to the five-prong adaptor connector 14 on case 10. The other end of the adaptor is an outlet connector with a physical configuration that corresponds to the outlet to be tested. Therefore, to test a standard three-prong 110V outlet common to residential and business facilities, an adaptor, 70, has an outlet connector 71 with three prongs on one end, and, electrically connected via wiring 72, the five-pronged connector 73 at the other end, as illustrated in FIG. 3. The five-pronged connector is inserted into the adaptor connector 14 and the three-pronged connector 71 is inserted into the electrical outlet to be tested. When the switch 13 is placed into the position to test the connect wire 21-wire 24 (X-W), a connection is made from wire 21 on the terminal block 26 from the adaptor connector 14 to the positive side of the digital voltage level testing circuit 30 and a connection is made from wire 24 on the terminal block 26 from the adaptor connector to the negative side of the digital voltage level testing circuit. Similarly, the other seven wire connection couplings can be tested, as noted previously. In each position of the switch to test the wiring couplings, the initiator switch 12 is engaged to obtain readings from the digital voltage level testing circuit on the display 11. When the initiator switch is engaged, this applies the power supply (such as the 9V direct current from a battery) to the digital voltage level testing circuitry to allow for voltage readings to be displayed. Illustrated in FIGS. 4a–4d are outlet connector configurations, similar to the outlet connector 71 shown in FIG. 3, for other adaptors for use in testing other electrical outlets having 2, 3, 4, or 5 prongs. These outlet connector configurations are only examples and other outlet connector configurations standard in use throughout the world are contemplated, as there are many different configurations used.

By using the device of the present invention, a user does not have to insert prongs into a live electrical outlet, potentially risking contact with the electrical outlet. By using an adaptor compatible with the outlet, a user does not have to know or guess into which part of the electrical outlet a prong must be inserted. By switching between various wire couplings and obtaining voltage readings, the user can quickly and easily obtain precise voltage readings and determine if the electrical outlet has the desired voltage as well as whether it has been wired properly and as required by electrical regulations. The device of the present invention is suitable for testing all generally accepted voltages from 100V–600V ac at frequencies from 50 Hz–100 Hz, whether in the United States or in other countries.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A electrical circuit testing device, comprising:
   a case, said case having surfaces consisting of a top surface, a bottom surface, a front surface, a rear surface and side surfaces connecting said top and bottom surfaces, said case comprising a display means on one of said surfaces, a non-shorting switching means on one of said surfaces, an initiator switch on one of said surfaces, and a five-pole electrical plug on one of said surfaces;
   a digital voltage level testing circuit, said digital voltage level testing circuit connected to said non-shorting switching means and connected to said display means;
   switching circuitry for testing wiring combinations, said switching circuitry electrically connected to said non-shorting switching means and a terminal block, said terminal block connect to said five-pole electrical adapter connector; and
   an adapter, said adapter having at one end a five-prong adapter plug for insertion into said five-pole electrical adapter connector on one of said surfaces on said case and at the other end having a multi-prong plug, said adapter capable of being plugged into an electrical outlet and transmitting voltages greater than 100 V.

2. The electrical circuit device of claim 1 said multi-prong plug is selected from the group consisting of a two-prong plug, a three-prong plug, a four-prong plug, and a five-prong plug.

3. The electrical circuit device of claim 1 wherein said digital voltage level testing circuit is a digital voltmeter.

4. The electrical circuit device of claim 1 wherein said display means is a digital display.

5. The electrical circuit device of claim 1 wherein said initiator switch is a depressable switch.

6. The electrical circuit device of claim 1 wherein said non-shorting switching means is a non-shorting rotary switch.

7. The electrical circuit device of claim 6 wherein said non-shorting rotary switch is a two-pole, eight-position, non-shorting rotary switch.

8. The electrical circuit device of claim 1 further comprising a handle for carrying the device.

9. The electrical circuit device of claim 1 wherein said digital voltage level testing circuit is capable of measuring voltages up to 600V alternating current.

10. The electrical circuit device of claim 1 wherein said digital voltage level testing circuit is capable of measuring voltages greater than 100V alternating current.

11. The electrical circuit device of claim 1 wherein said digital voltage level testing circuit is capable of measuring voltages at frequencies greater than 50 Hz and less than 100 Hz.

* * * * *